United States Patent
Nadd

(10) Patent No.: US 7,456,686 B2
(45) Date of Patent: Nov. 25, 2008

(54) CLASS AD AUDIO AMPLIFIER

(75) Inventor: Bruno Nadd, Lourmarin (FR)

(73) Assignee: International Rectifier Corporation, El Segundo, CA (US)

( * ) Notice: Subject to any disclaimer, the term of this patent is extended or adjusted under 35 U.S.C. 154(b) by 5 days.

(21) Appl. No.: 11/534,040

(22) Filed: Sep. 21, 2006

(65) Prior Publication Data

US 2007/0063764 A1    Mar. 22, 2007

Related U.S. Application Data

(60) Provisional application No. 60/719,281, filed on Sep. 21, 2005.

(51) Int. Cl.
*H03F 3/38* (2006.01)
(52) U.S. Cl. ......................... 330/10; 330/251
(58) Field of Classification Search .................. 330/10, 330/251, 207 A
See application file for complete search history.

(56) References Cited

U.S. PATENT DOCUMENTS

| | | | | |
|---|---|---|---|---|
| 4,560,946 A | * | 12/1985 | Yokoyama | .................. 330/149 |
| 6,016,075 A | * | 1/2000 | Hamo | .......................... 330/10 |
| 6,107,875 A | * | 8/2000 | Pullen et al. | ................... 330/10 |
| 6,297,693 B1 | * | 10/2001 | Pullen | .......................... 330/10 |
| 6,768,376 B2 | * | 7/2004 | Hoyt et al. | ..................... 330/10 |

* cited by examiner

*Primary Examiner*—Henry K Choe
(74) *Attorney, Agent, or Firm*—Ostrolenk, Faber, Gerb & Soffen, LLP

(57) ABSTRACT

An audio amplifier comprising a Class D audio amplifier having an input receiving an analog input signal, a pulse width modulation stage for converting the analog input signal to a pulse width modulated signal, a driver stage receiving the pulse width modulated signal and for producing a driver PWM signal and an output switching audio amplifier stage receiving the driver PWM signal and providing an amplified PWM signal; an output filter stage receiving the amplified PWM signal for converting the amplified PWM signal into an analog audio signal; and a linear output amplifier stage receiving as inputs the analog input signal and the output of the output filter stage, the output of the output filter stage serving to bias the linear output amplifier stage. In one embodiment, two floating power supplies are superimposed on the output of the filter stage for biasing the linear amplifier, one at a preset voltage above the output signal of the filter stage and a second at a preset voltage below the output of the filter stage. The linear output amplifier stage provides an analog output to a sound reproduction transducer.

16 Claims, 9 Drawing Sheets

CLASS AD AUDIO AMPLIFIER

CROSS-REFERENCE TO RELATED APPLICATIONS

The present application claims the priority and benefit of U.S. Provisional Application Ser. No. 60/719,281 filed Sep. 21, 2005 entitled CLASS AD AUDIO AMPLIFIER, the entire disclosure of which is hereby incorporated by reference.

BACKGROUND OF THE INVENTION

The present invention relates to audio amplifiers and in particular, to digital or switching audio amplifiers, and more particularly, to an improvement of the digital or switching audio amplifier which has been designated as the Class D audio amplifier. In particular, the invention relates to what is called herein as a Class AD audio amplifier which is a hybrid amplifier comprising both a Class D and a Class A amplifier.

In a Class D amplifier, the audio information is contained within pulse width modulated signals driving an output switching amplifier circuit which provides a pulse width modulated output through a low pass filter to a loudspeaker. With reference to FIG. 1, a basic Class D audio amplifier is shown. An analog input is fed to an analog front end 10 which is an analog audio preamplifier. The analog audio signal is converted to a pulse width modulated output signal 20 by a PWM converter 25 in which the audio information is present in the duty cycle of the pulse width modulated signal. The pulse width modulated signal is then fed to a gate driver 30 which then drives the Class D audio switching stage 40 typically comprising two series-connected switches Q1 and Q2 connected in a half bridge arrangement between opposite supply voltages ±Vcc. The output is taken at the switched node Vs between the two transistors. A full bridge can also be employed. The output is a pulse width modulated signal which is fed to a low pass filter 50, i.e., an LC filter, which restores the audio information to analog form which is then provided to the load, a loudspeaker. Feedback 55 is provided from the switched node VS to the analog front end via feedback stage 60 to provide a negative feedback to control the level of the output at the desired level.

Class D amplifiers provide high efficiency and high power although they may present more distortion than a linear or Class A amplifier. In addition, Class D amplifiers have output ripple as a result of the pulse width modulation.

Class D amplifiers are very efficient but reproduction quality has suffered in the past but is improving dramatically. In contrast, linear amplifiers such as Class A and Class AB amplifiers provide low efficiency but high fidelity. Typically, Class A amplifiers are limited to a few watts RMS and Class AB amplifiers, which provide a good compromise, are practical up to the 100-200 watt range.

In the Class D amplifier, in the output LC filter, there is very little headroom between the upper audio band and the practical switching frequency which is 300-1,000 KHz typically.

The feedback loop in a Class D amplifier is taken before the output filter which requires the inductance to be fairly linear. Intermodulation distortion in the Class D amplifier is present but is often not sensed by simple single frequency total harmonic distortion (THD) measurement. Further, a residual or ripple signal at the switching frequency can be one volt or more. There is a risk of audible beats of the non-coherent ripple signal with the input.

SUMMARY OF THE INVENTION

It is an object of the present invention to provide an improved switching amplifier that has high efficiency like a Class D amplifier but better fidelity with less distortion. Accordingly, it is an object of the present invention to provide an amplifier which has the advantages of a Class D amplifier but also has the fidelity of a linear amplifier.

According to the invention, a hybrid amplifier comprising a Class AD amplifier is provided.

According to the invention, an audio amplifier is provided comprising a Class D audio amplifier having an input receiving an analog input signal, a pulse width modulation stage for converting the analog input signal to a pulse width modulated signal, a driver stage receiving the pulse width modulated signal and for producing a driver PWM signal and an output switching audio amplifier stage receiving the driver PWM signal and providing an amplified PWM signal; an output filter stage receiving the amplified PWM signal for converting the amplified PWM signal into an analog audio signal; and a linear output amplifier stage receiving as inputs the analog input signal and the output of the output filter stage, the output of the output filter stage serving to bias the linear output amplifier stage, the linear output amplifier stage providing an analog output to a sound reproduction transducer.

In one embodiment, the linear output amplifier stage is biased by two floating power supplies which are superimposed on the output of the filter stage such that the linear output amplifier stage has two bias supplies, one at a preset voltage above the output signal of the filter stage and a second at a preset voltage below the output of the filter stage.

Other features and advantages of the present invention will become apparent from the following description of the invention which refers to the accompanying drawings.

BRIEF DESCRIPTION OF THE DRAWING(S)

The invention will now be described in greater detail in the following detailed description with reference to the drawings in which.

DETAILED DESCRIPTION OF PREFERRED EMBODIMENTS OF THE INVENTION

Figure 1:
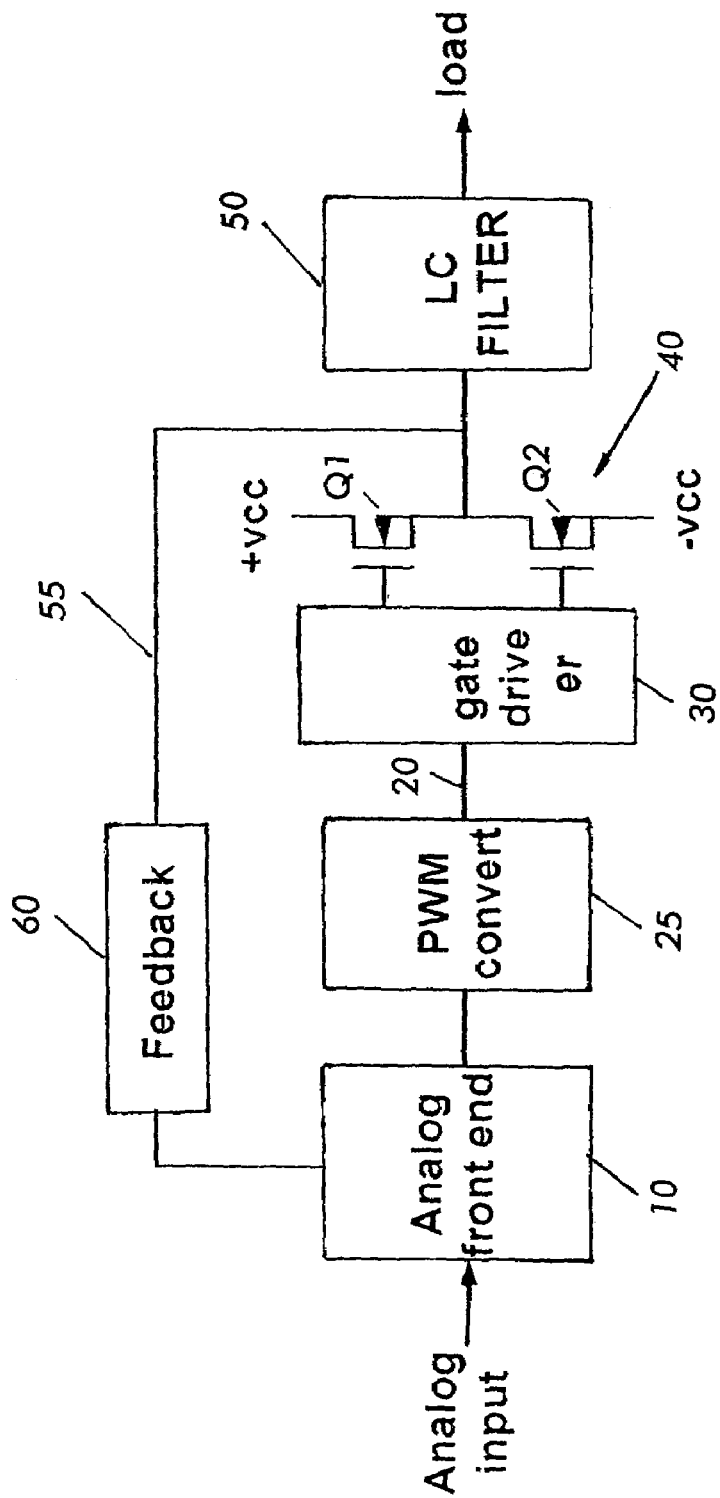
FIG. 1 shows a prior art Class D audio amplifier.
Figure 2:
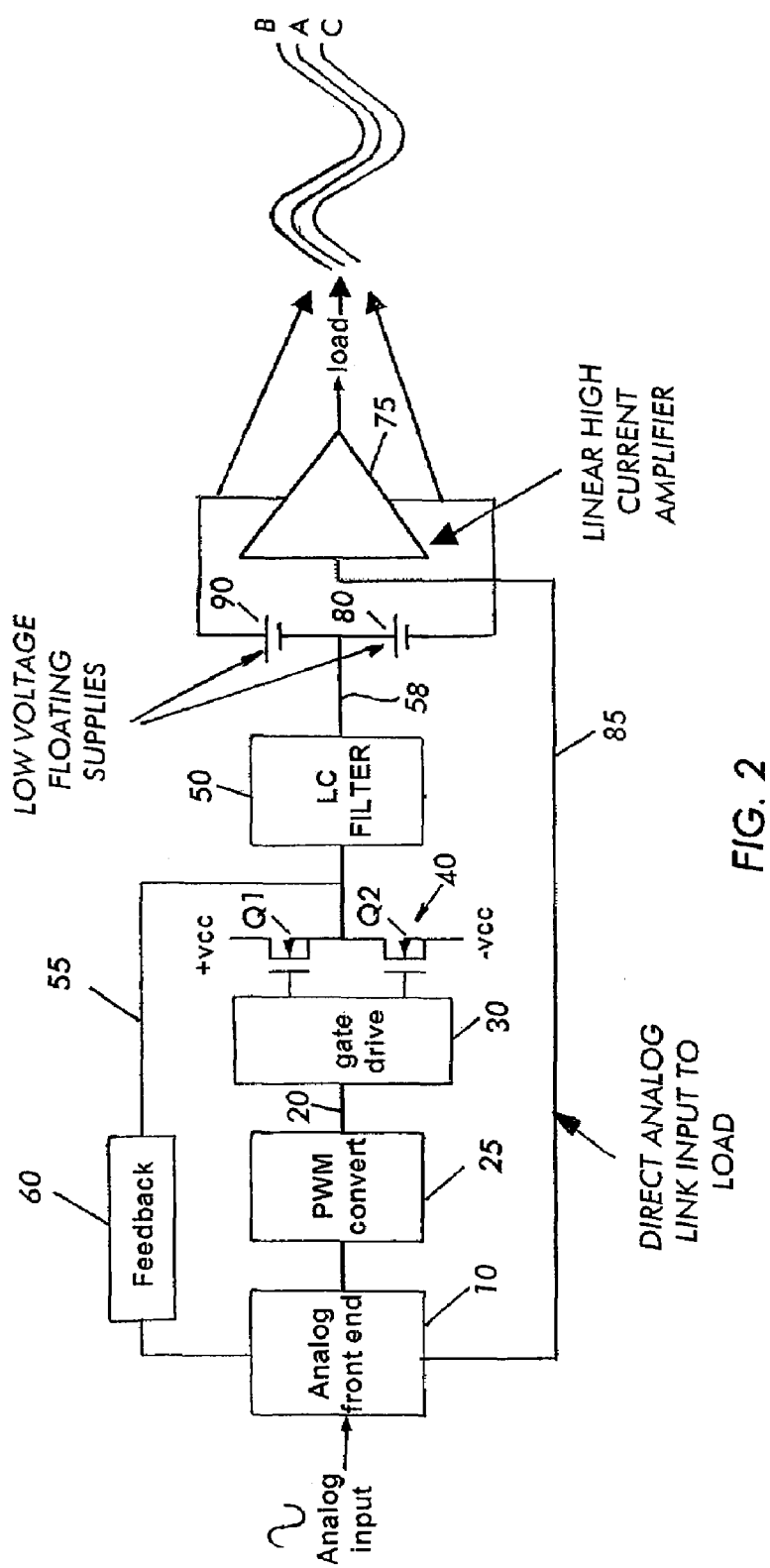
FIG. 2 shows the Class AD amplifier according to the invention.

With reference again to the drawings, FIG. 2 shows an audio amplifier according to the present invention which is denominated herein a Class AD audio amplifier. Like the Class D audio amplifier in FIG. 1, an analog input is fed to an analog front end pre-amplifier stage 10, the output of which is an analog signal which is provided to a PWM conversion stage 25. The output 20 of the PWM conversion stage 25 is a pulse width modulated signal in which the duty cycle of the pulse width modulated signal contains the audio information. The pulse width modulated signal from the PWM converter 25 is then fed to a gate drive circuit 30 which drives the Class D audio amplifier output stage 40. The Class D audio amplifier output stage 40 comprises two transistors Q1 and Q2 connected in the half-bridge arrangement with each transistor having a main electrode coupled to opposite supply voltages. Alternatively, a full bridge arrangement can be employed. In the embodiment shown, the transistors are MOSFETs and the common source-drain connection comprising the switching node VS is coupled to the low pass LC filter 50 which converts the PWM signal to an analog audio signal 58. As before, a negative feedback stage 60 is coupled from the switching node VS to the analog front end. The output of the LC filter 50 is provided to a Class A amplifier stage comprising a linear high current amplifier 75 which is biased by two low voltage floating supplies 80 and 90 superimposed on the analog signal 58 from the Class D amplifier. This is shown by the waveforms at the right side of FIG. 2 which shows the two analog signals B and C having the supply voltages superimposed thereon. In the case shown, a sinusoidal input signal is provided, resulting in two sinusoidal signals, one above and one below the output signal A of the linear high current amplifier 75. The input to the linear high current amplifier 75 is provided from the analog input signal front end on an analog link 85. The signal applied to the load is shown in the waveform A to the right sandwiched between the two bias supplies modulated by the converted audio output of the Class D amplifier.

Figure 3:
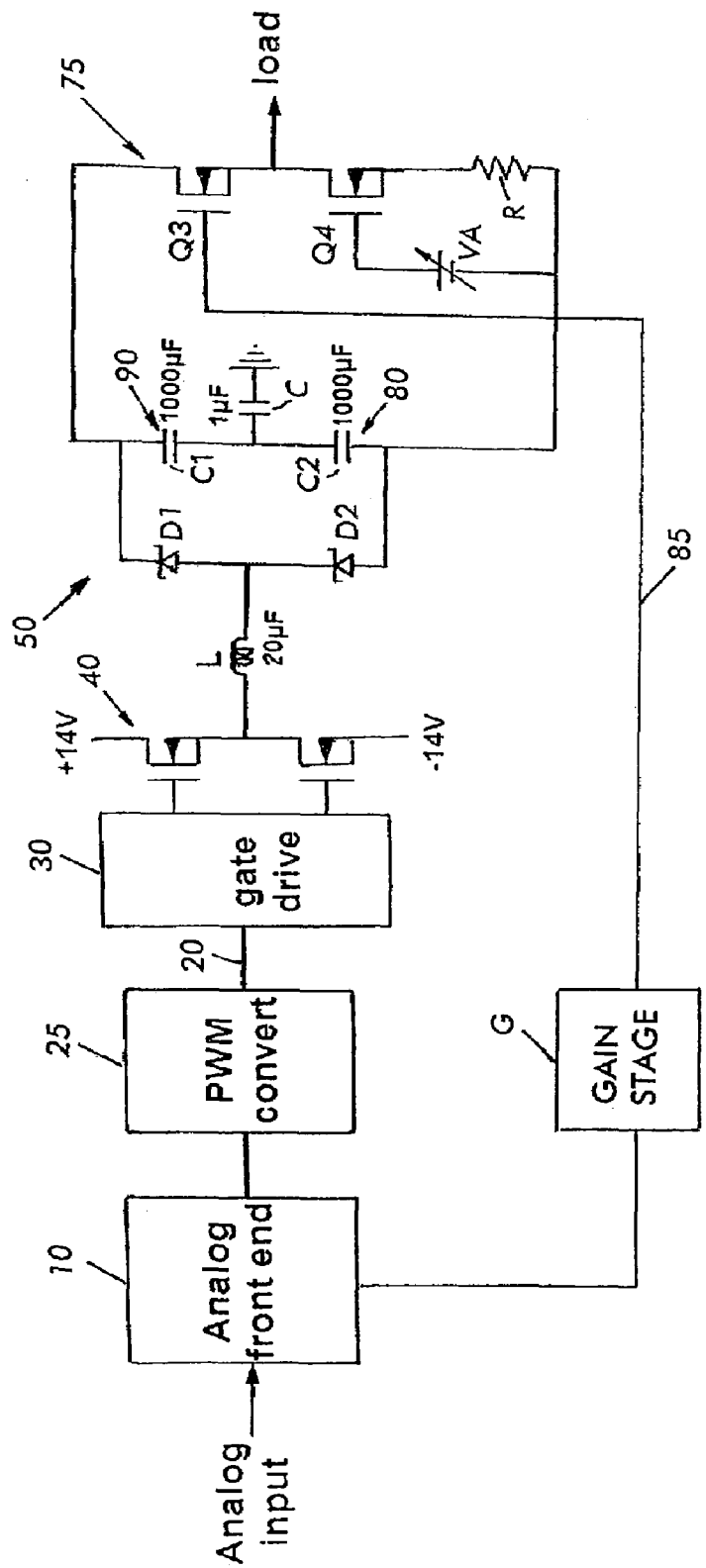
FIG. 3 shows one implementation of a Class AD audio amplifier.

FIG. 3 shows one implementation of the circuit of FIG. 2. In this circuit, the two Class D switching stage 40 transistors Q1 and Q2 are coupled to plus and minus 14 volt supplies as shown. The LC filter 50 comprises an inductance L and a capacitor C. The floating supplies are implemented by rectification of the output signal from the Class D amplifier by the two diodes D1 and D2 as shown to provide voltages across two capacitors C1 and C2. These provide the plus and minus floating bias supply voltages for the linear high current amplifier 75. The linear amplifier 75 comprises two transistors Q3 and Q4. The node between the two transistors Q3 and Q4 is provided to the output loudspeaker. The analog link 85 including a gain stage G is coupled to the gate of transistor Q3 to provide the analog input to the Class A linear amplifier. The other transistor Q4 has its gate coupled to an appropriate bias voltage source VA to bias the Class A amplifier in its linear range.

In the example shown, the ripple current from the output of the Class D amplifier after filtering is rectified by the diodes and the two capacitors C1 and C2 are charged up. The bias current of the output stage will increase until a new equilibrium is found. The output high side transistor Q3 operates as a source-follower. High current injection ensures high transconductance and very low open loop distortion. Because the output stage is quasi-current-fed by transistor Q4, the bias scheme shown including the voltage source VA and resistor R can be used.

Figure 4:
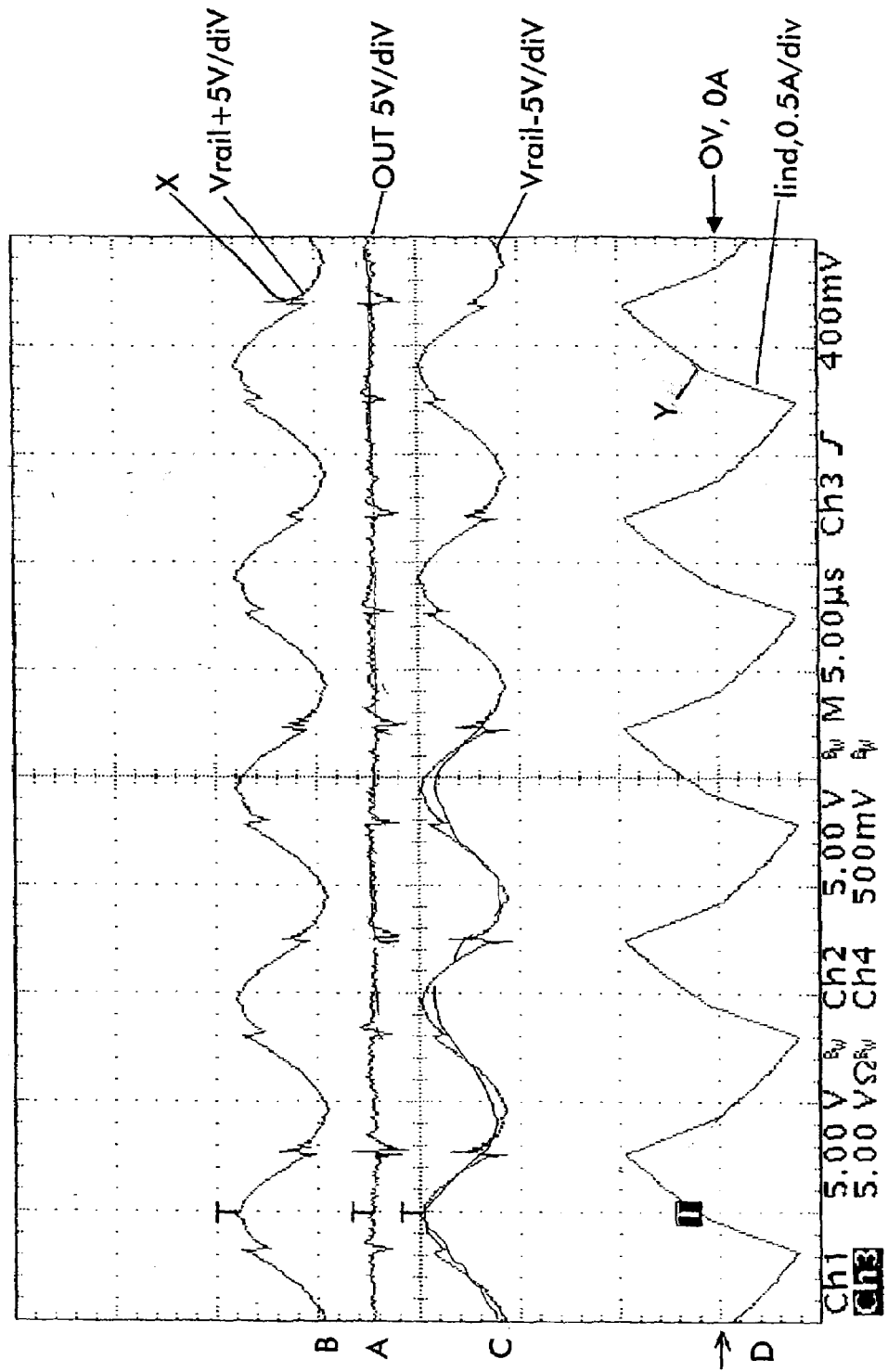
FIG. 4 shows waveforms in the Class AD audio amplifier without audio modulation with a time scale of five microseconds per division.

FIG. 4 shows the waveforms of the Class AD audio amplifier without any input audio modulation. As shown, the output, which is fed to the loudspeaker, is found at Trace A. The two floating supplies are Traces B and C. Trace D shows the current through the inductor L. Note the lack of ripple in Trace A as compared to Traces B and C, which show the output ripple typical of a Class D amplifier.

Figure 5:
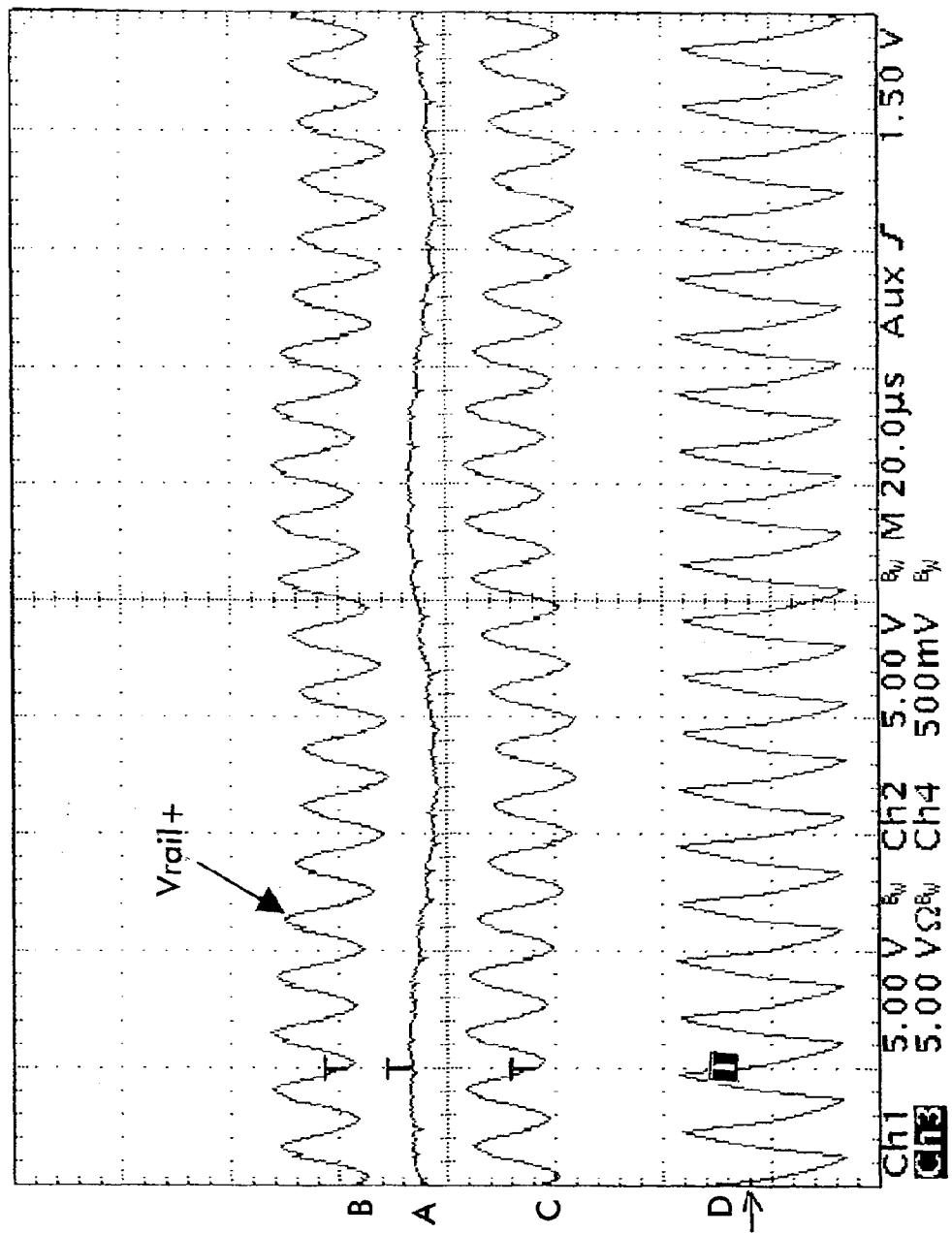
FIG. 5 shows waveforms in the Class AD audio amplifier with a 10 KHz audio input signal with a time scale of 20 microseconds per division.

FIG. 5 shows waveforms in the Class AD audio amplifier with a 10 KHZ audio input signal. Again, the output is shown at A and the two floating supplies are shown at B and C. Waveform D shows the current through the inductor. The ripple due to the Class D amplifier is readily apparent in this graph.

Figure 6:
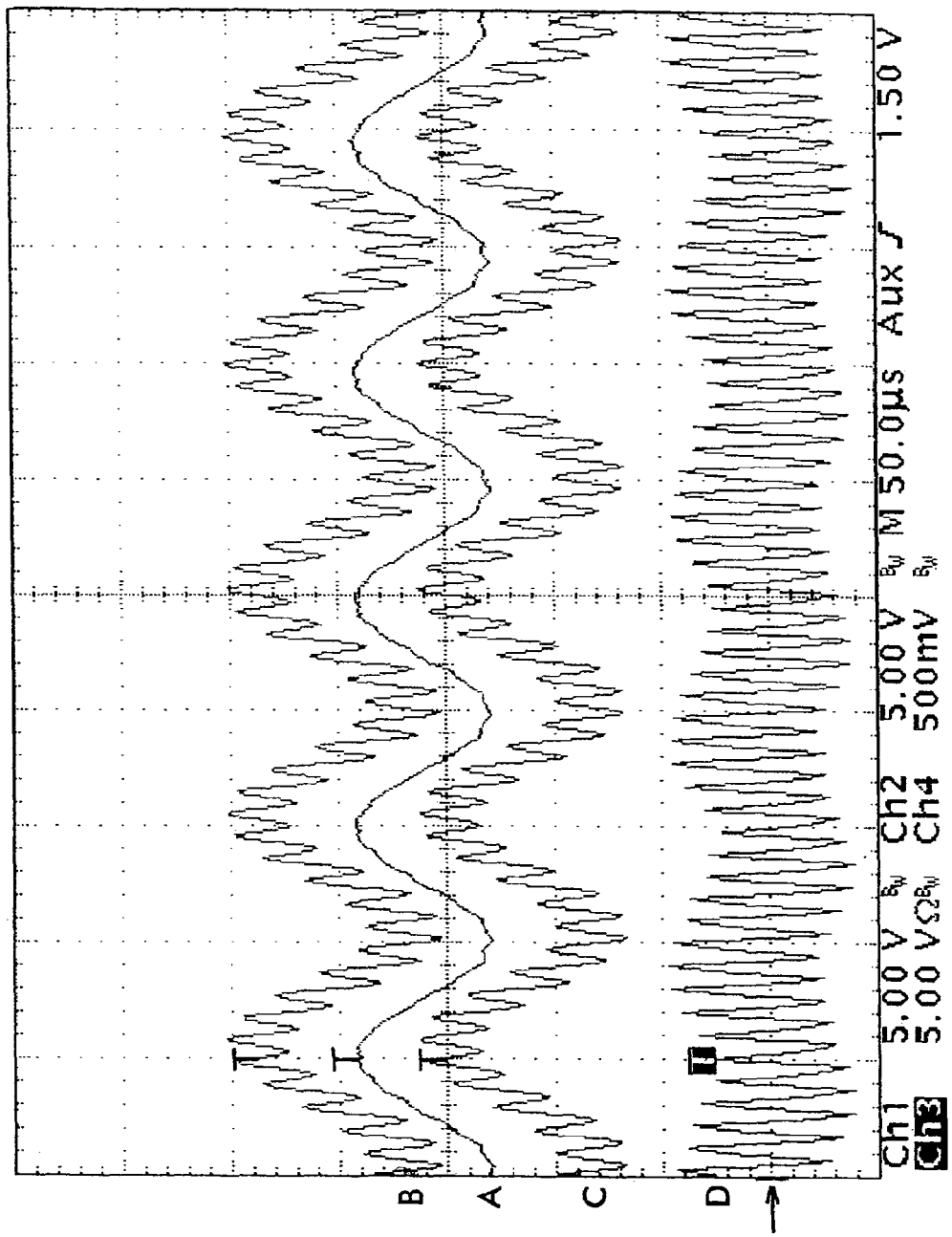
FIG. 6 shows waveforms of the Class AD audio amplifier with a 10 KHz audio input signal with a time scale of 50 microseconds per division.

FIG. 6 shows the same waveforms at a time base of 50 micro seconds per division. The input modulating signal is more apparent in this graph. The reduced ripple in the output signal A is also apparent.

Figure 7:
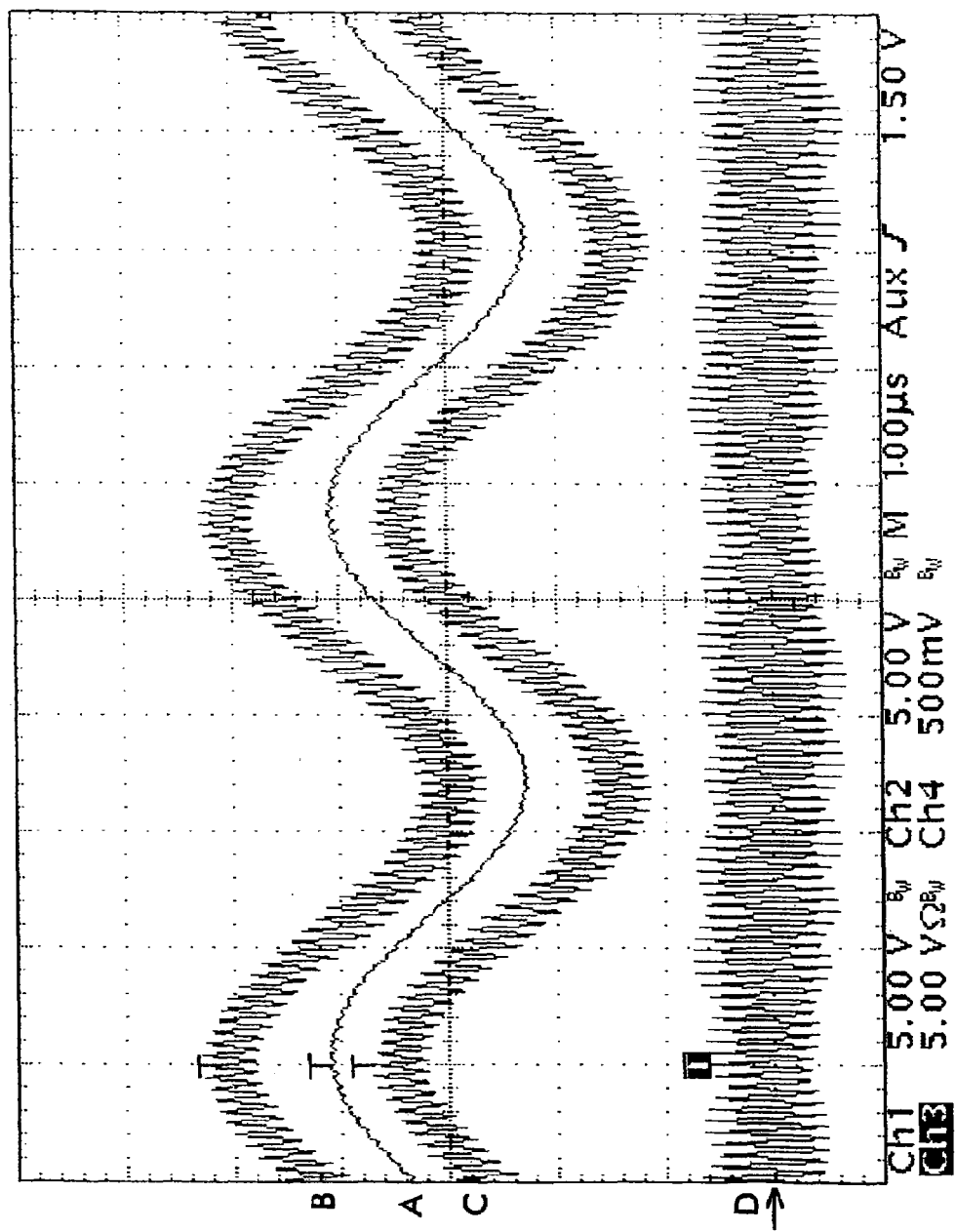
FIG. 7 shows waveforms of the Class AD audio amplifier with a 2 KHz audio input signal with a time scale of 100 microseconds per division.

FIG. 7 shows the waveforms with a 2 KHz audio input signal with a time base of 100 micro seconds per division.

As shown, the output ripple in the output waveforms A is greatly reduced providing a higher fidelity and sound quality.

Figure 8:
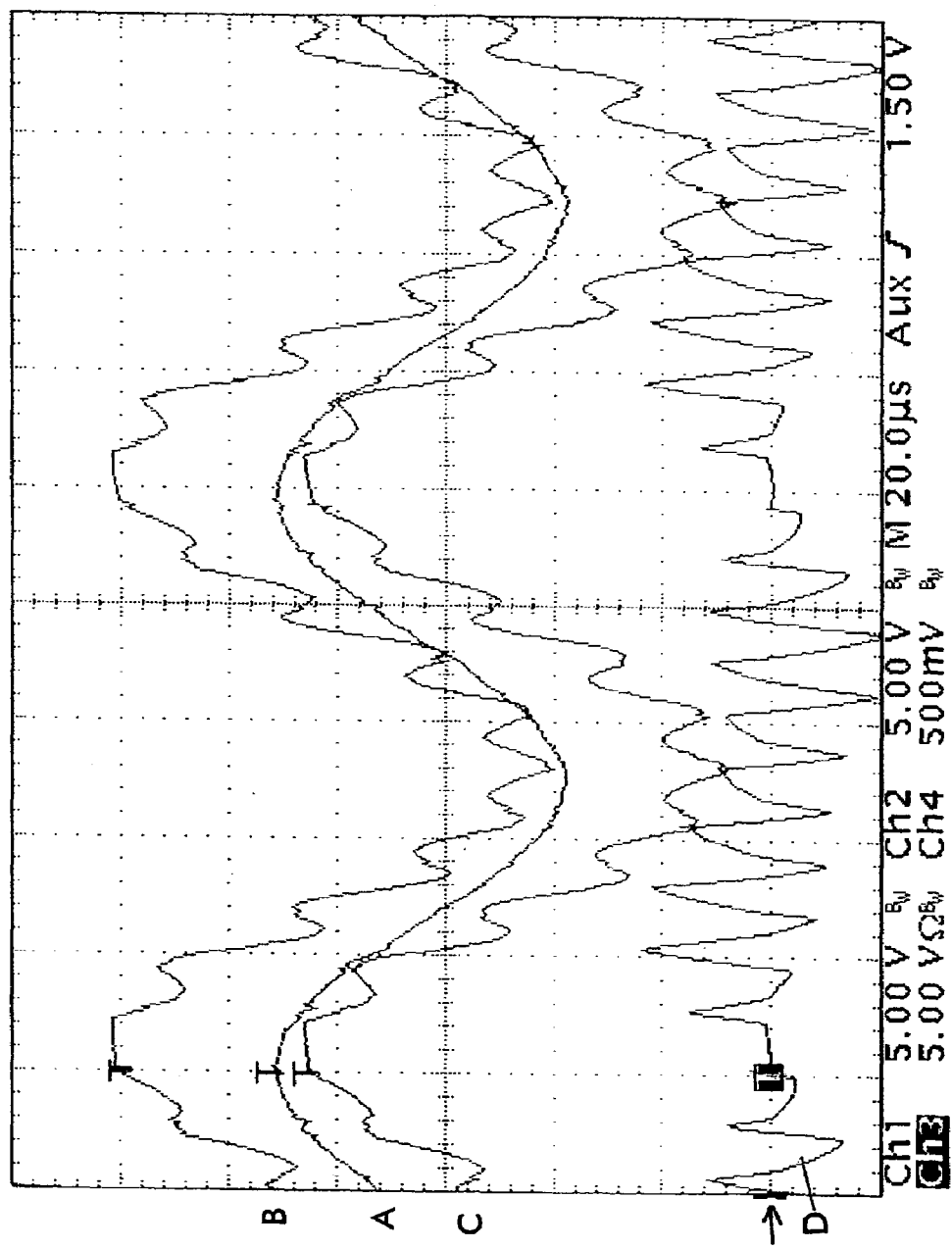
FIG. 8 shows waveforms in the Class AD audio amplifier at the limit of clipping with a time scale of 20 microseconds per division.

FIG. 8 shows the Class D audio amplifier of the Class AD amplifier at the limit of clipping. As can be seen, the two floating supplies are near clipping or just clipping yet the output A remains unclipped.

Figure 9:
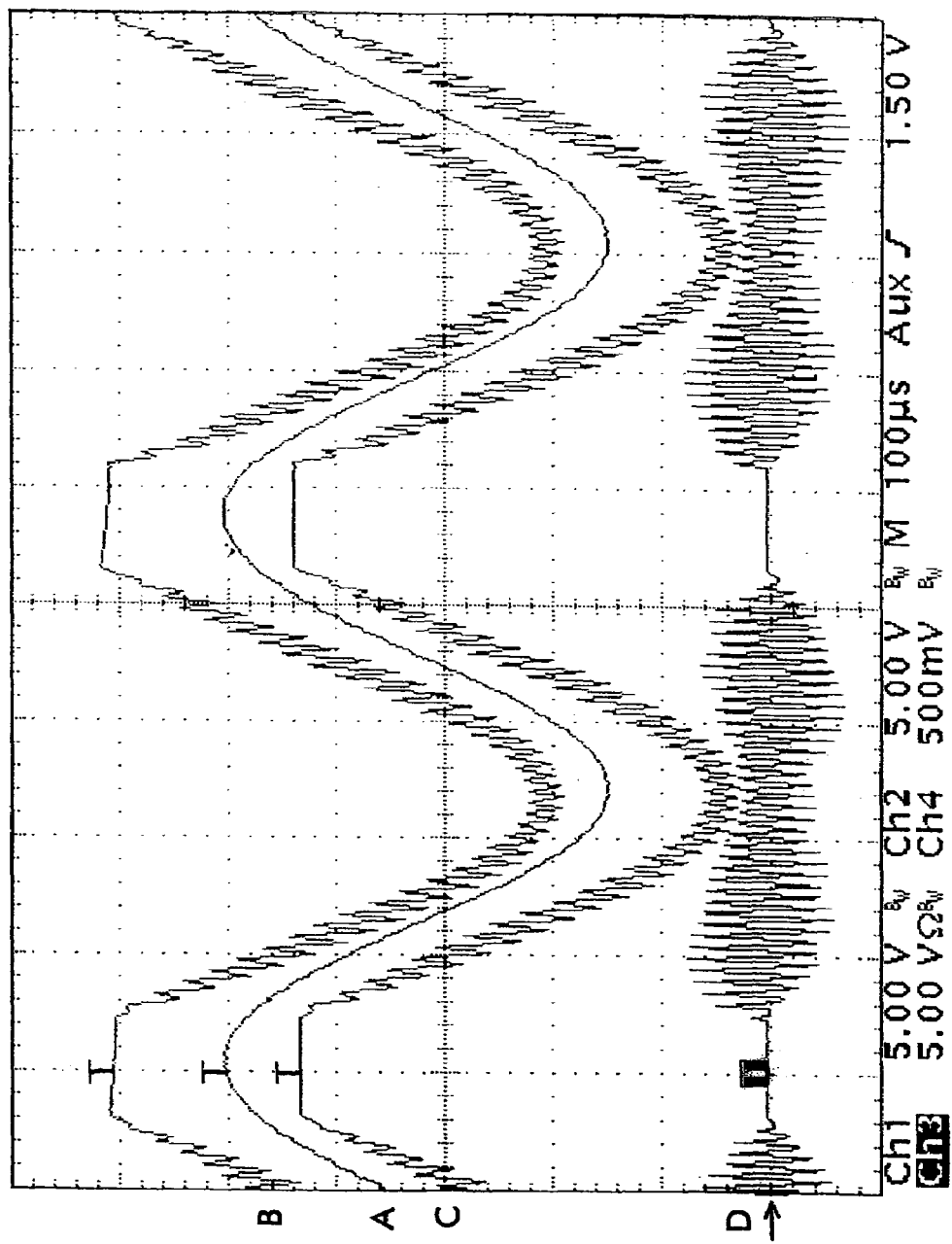
FIG. 9 shows waveforms in a Class AD audio amplifier where the Class D audio amplifier is clipping while the linear stage remains unclipped and the time scale is 100 microseconds per division.

FIG. 9 shows waveforms where the Class D amplifier is clearly clipping yet the output waveform A is clean and unclipped.

Turning again to FIG. 4, where there is no audio modulation, one can see that the floating supply rails shown by waveforms B and C have some glitches, for example at X. This high frequency glitch may be caused by the dead time between the Class D stage amplifiers not being optimized or the ESR of the capacitors. The 100 KHz PWM switching ripple is practically eliminated in the output A by the post-linear amplifier. Some high frequency noise is left in waveform A due to the Miller capacitance of the source-follower.

With respect to waveform D, which shows the inductor current, the change of the slope at Y occurs when the inductor load current crosses zero.

The circuit of FIG. 3 was implemented and the headphone output of a CD audio reproduction device, in particular a Phillips 923 CD player, was provided as the input. The listening experience was amazingly good, showing all the benefits of a Class A amplifier including high musical presence given by non-masked low level information such as audio information in harmonics of strings, church reverberation and air blowing through organ pipes. The sound was dynamic despite the modest power with the silent periods being very silent. Voices are distinct from the rest of the audio information, and the amplifier is believed to have a low intermodulation distortion and the clipping is progressive and not very aggressive.

It is believed that the invention will allow a poorer Class D amplifier when cascoded in accordance with the invention with a Class A amplifier to give excellent results, i.e., the outstanding quality of the sound of the Class A with the high efficiency of the Class D. It is believed that the invention will provide an alternative to trying to make a good Class D amplifier by massive digital processing. It removes the tight constraints on the switching MOSFETs, drivers and output inductance and can be integrated with robust cost effective semiconductor manufacturing processes.

The invention is applicable to other types of Class D amplifier including Class D amplifiers using full bridge. The invention may also be applicable to current stage output stages and resonant front ends with phase control. The invention may also be useable with a Class AB amplifier.

It is believed that, in the invention, the linear audio amplifier controls the sound quality whereas the Class D front end provides the power. The Class D amplifier does not appear to have significant impact on the sound quality. The non-linearities in the Class D front end may impact the linear stage power efficiency. The tracking floating supplies in the Class A amplifier must be higher than the ripple voltage on the LC filter.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. An audio amplifier comprising:
    a Class D audio amplifier having an input circuit receiving an analog input signal, a pulse width modulation stage for converting the analog input signal to a pulse width modulated (PWM) signal, a driver stage receiving the pulse width modulated signal and for producing a driver PWM signal and an output switching audio amplifier stage receiving the driver PWM signal and providing an amplified PWM signal;
    an output filter stage receiving the amplified PWM signal for converting the amplified PWM signal into an analog audio signal; and
    a linear output amplifier stage receiving as inputs the analog input signal and the output of the output filter stage, the output of the output filter stage serving to bias the linear output amplifier stage, the linear output amplifier stage providing an analog output to a sound reproduction transducer.

2. The audio amplifier of claim 1, wherein the linear output amplifier stage has two floating power supplies which are superimposed on the output of the filter stage for biasing the linear output amplifier stage whereby two bias supplies are provided, one at a preset voltage above the output signal of the filter stage and a second at a preset voltage below the output of the filter stage.

3. The audio amplifier of claim 1, further comprising a negative feedback stage provided between the output of the output switching audio amplifier stage and the input circuit receiving said analog input signal.

4. The audio amplifier of claim 1, wherein the analog input signal is provided to the linear output amplifier by an analog audio input link.

5. The audio amplifier of claim 4, wherein the audio input link comprises a gain stage.

6. The audio amplifier of claim 2, wherein the linear output amplifier comprises a Class A audio amplifier.

7. The audio amplifier of claim 1, wherein the output filter stage comprises an LC filter.

8. The audio amplifier of claim 6, wherein the linear output amplifier stage comprises first and second transistors coupled in a series arrangement with an output node disposed between the transistors and wherein the first transistor is coupled to the first floating power supply and the second transistor is coupled to the second power floating supply.

9. The audio amplifier of claim 8, further comprising a bias supply coupled to the control electrode of the second transistor and wherein the analog audio input signal is provided to a control electrode of the first transistor.

10. The audio amplifier of claim 8, wherein the first floating power supply comprises a rectifier and a storage capacitor wherein the rectifier is connected to produce a positive voltage with respect to a common node and the second rectifier is connected to produce a negative voltage with respect to the common node.

11. The audio amplifier of claim 10, wherein the rectifiers rectify a ripple current present in the output from the output switching audio amplifier stage.

12. The audio amplifier of claim 8, wherein said first transistor comprises a source follower stage.

13. The audio amplifier of claim 1, wherein the output switching audio amplifier stage comprises a half bridge.

14. The audio amplifier of claim 13, wherein the half bridge is coupled between two equal and opposite power supply sources.

15. The audio amplifier of claim 9, further comprising a resistance in series with said second transistor.

16. An audio amplifier comprising:
    a class D amplifier having an analog input and providing a digital output to an output filter stage; the output filter stage providing a converted analog output;
    a linear amplifier having two inputs, a first input comprising the analog input and a second input comprising the converted analog output, wherein the converted analog output comprises a bias voltage supply for the linear amplifier.

* * * * *